United States Patent [19]
Aipperspach et al.

[11] Patent Number: 5,991,224
[45] Date of Patent: Nov. 23, 1999

[54] GLOBAL WIRE MANAGEMENT APPARATUS AND METHOD FOR A MULTIPLE-PORT RANDOM ACCESS MEMORY

[75] Inventors: Anthony Gus Aipperspach; Peter Thomas Freiburger; Peder James Paulson, all of Rochester, Minn.

[73] Assignee: International Business Machines Corporation, Armonk, N.Y.

[21] Appl. No.: 09/084,127

[22] Filed: May 22, 1998

[51] Int. Cl.$^6$ ...................................................... G11C 8/00
[52] U.S. Cl. ........................................ 365/230.05; 365/63
[58] Field of Search ................................ 365/230.05, 63, 365/52, 230.06

[56] References Cited

U.S. PATENT DOCUMENTS

| | | | |
|---|---|---|---|
| 4,627,030 | 12/1986 | Barber | 365/189 |
| 4,893,280 | 1/1990 | Gelsomini et al. | 365/230.05 |
| 4,933,899 | 6/1990 | Gibbs | 365/230.05 |
| 5,216,636 | 6/1993 | Runaldue | 365/230.05 |
| 5,430,685 | 7/1995 | Nakada | 365/230.05 |
| 5,544,122 | 8/1996 | Mizukami et al. | 365/230.05 |
| 5,790,883 | 8/1998 | Sugita | 365/230.05 |
| 5,866,919 | 3/1999 | Morikawa et al. | 365/63 |
| 5,877,976 | 3/1999 | Lattimore et al. | 365/63 |

*Primary Examiner*—Tan T. Nguyen
*Attorney, Agent, or Firm*—Mark A. Hollingsworth

[57] ABSTRACT

A global wire management apparatus and method for a multiple port random access memory (RAM) is disclosed. The RAM includes an array of stacked dual memory cell structures each including a common row/column decoder disposed between an upper memory cell and lower memory cell. The upper memory cell is situated adjacent upper transfer gate circuitry, and the lower memory cell is situated adjacent lower transfer gate circuitry. The decoder circuit is oriented vertically in the middle of the dual memory cell structure so that the true and complement decoder outputs may be fed upwards and downwards to the upper and lower transfer gate circuits. Wiring of the upper and lower transfer gate circuits may be effected completely at the local interconnect layer. Each of the write ports of the common decoder includes a NAND gate, an inverter, and a transfer gate for each of the upper and lower memory cells for controlling the transfer of data to the upper and lower memory cells. The disclosed global wiring management methodology provides an approach for reducing the number of global interconnect wires in a multiple port random access memory cell by sharing various wiring channels between memory cells. Such an approach allows a number of the memory cell global signal interconnects to be moved from the global wiring plane to the local wiring plane.

37 Claims, 15 Drawing Sheets

GLOBAL WIRE MANAGEMENT APPARATUS AND METHOD FOR A MULTIPLE-PORT RANDOM ACCESS MEMORY

FIELD OF THE INVENTION

This invention relates to a programmable memory device, and more particularly, to a global wire management apparatus and method for a multiple port random access memory.

BACKGROUND OF THE INVENTION

Multiple port random access memories are generally configured to include a number of ports, each of which typically represents an independent input/output path for accessing data stored in a memory array. A multiple port RAM may, for example, include a number of read ports and write ports, as well as a scan port for supporting scan-based testing of the memory device. It is noted that the number of read ports need not be the same as the number of write ports.

A significant problem encountered when attempting to increase the number of ports to a programmable memory array concerns the increased complexity of the global wiring management strategy for the memory device. Although it is now possible to design a random access memory with greater than six read ports and six write ports, for example, the total area allocated to support global wiring for all of the read and write ports often exceeds the total device area.

Increasing the memory cell area to accommodate the total number of wiring channels necessitated by global wiring requirements is generally not a desired solution, since such an increase will result in increasing the overall size of the memory array. By way of example, a memory cell of a multiple port random access memory array may require 480 sq. wiring channels to implement the memory cell transistors of a given cell layout. Implementing a conventional global wiring management approach for this cell layout would typically require 600 sq. wiring channels, thus necessitating an increase in memory cell size by approximately 25%.

Another problem encountered when increasing the number of ports for a programmable memory array concerns the node capacitance at the input of the memory cells. In general, the capacitance at the input of a given memory cell increases with each additional write port connected thereto. Such increases in input node capacitance of the memory cell generally results in an appreciable degradation in memory cell write speed.

Yet another problem that arises when attempting to increase the number of ports to a programmable memory array concerns a heightened potential of compromising data integrity or data stability within the memory cell that may occur during a charge sharing event. A write port for a conventional multiple write port RAM, for example, typically includes a pair of series connected transfer gates. Under certain conditions, a charge sharing event may occur in which the cumulative capacitance at the memory cell input and at a node defined between the two transfer gates may contribute to an inadvertent and potentially catastrophic flipping of the memory cell state.

There is, therefore, a need for an improved global wiring management approach for a multiple port random access memory. There exists a further need for an improved global wiring management approach which utilizes a device area-limited design rather than a wiring-limited design. There exists a further need for improved write port circuitry for multiple write port RAM applications which provides for reduced circuit capacitance and memory cell input capacitance, good performance and noise characteristics, and one that does not result in an increase in circuit element size or number of transistors. The present invention fulfills these and other needs.

SUMMARY OF THE INVENTION

The present invention is directed to a global wiring management apparatus and method for a multiple port programmable memory. In accordance with one embodiment of the present invention, a multiple port programmable memory includes a first memory cell of a memory array and a second memory cell of the memory array. An interconnect includes a plurality of write row select lines, a plurality of write column select lines, and a plurality of data input lines. A decoder circuit includes an output coupled to each of the first and second memory cells, and an input coupled to the write row select lines and the write column select lines such that the write row select lines are shared between the first and second memory cells.

In another embodiment of the present invention, a multiple port programmable memory includes a first memory cell of a memory array and a second memory cell of the memory array. An interconnect includes a plurality of write row select lines, a plurality of write column select lines, and a plurality of data input lines. Each of a plurality of first transfer gates is coupled to the first memory cell and to one of the plurality of data input lines. Each of a plurality of second transfer gates is coupled to the second memory cell and to one of the plurality of data input lines. A decoder circuit is disposed substantially between the first and second memory cells and comprises a plurality of write port decoders. Each of the write port decoders includes an input coupled to a respective one of the plurality of write row select lines and write column select lines, and an output coupled to a respective one of the plurality of first and second transfer gates such that the write row select lines are shared between the first and second memory cells.

In accordance with yet another embodiment of the present invention, each of a plurality of first transfer gates is coupled to a first memory cell of a memory array and to one of a plurality of data input lines. Each of a plurality of second transfer gates is coupled to a second memory cell of the memory array and to one of the plurality of data input lines. A decoder circuit includes a plurality of write port decoders. Each of the write port decoders comprises a NAND gate having a first input coupled to one of a plurality of global write row select lines, and a second input coupled to one of a plurality of global write column select lines. Each of the write port decoders also includes an output coupled to the first control input of a respective one of the plurality of first and second transfer gates. Each of the write port decoders further includes an inverter having an input coupled to the output of the NAND gate and an output coupled to the second control input of the respective one of the plurality of first and second transfer gates.

In yet another embodiment, a stacked dual memory cell structure includes a common decoder disposed between an upper memory cell and a lower memory cell. The upper memory cell is situated adjacent upper transfer gate circuitry, and the lower memory cell is situated adjacent lower transfer gate circuitry. The decoder circuit is oriented vertically in the middle of the dual memory cell structure so that the true and complement decoder outputs may be fed upwards and downwards to the upper and lower transfer gate circuits. This embodiment provides for wiring of the upper and lower transfer gate circuits entirely at a local interconnect layer. In this configuration, neither the Metal 1 (M1) level interconnect layer nor any other interconnect layer above the local interconnect layer need be used to effect the required wiring of the upper and lower transfer gate circuitry.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
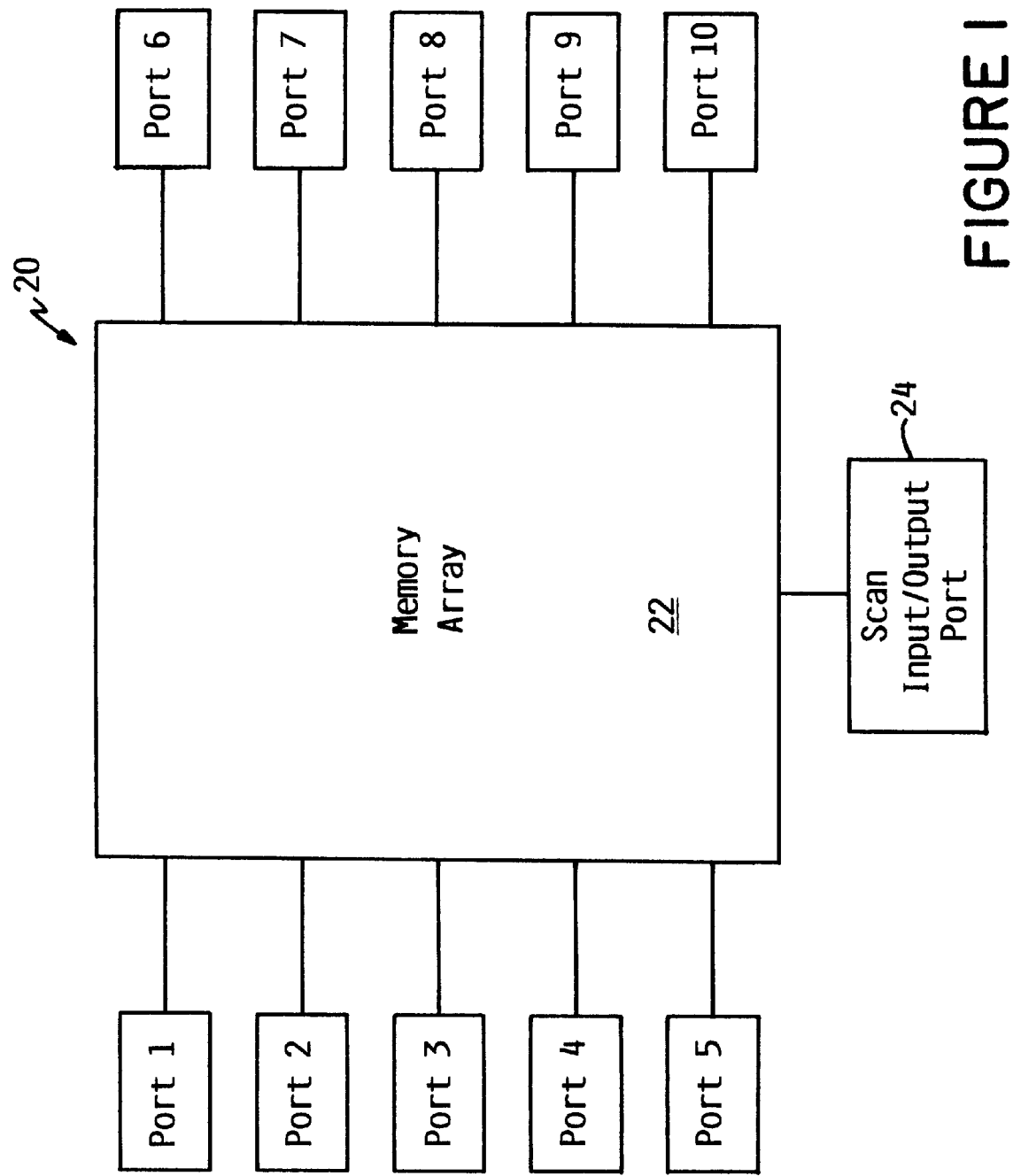
FIG. 1 is a generalized block diagram of a multiple port programmable memory device including a number of read and write ports for accessing a memory array.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the spirit and scope of the invention as defined by the appended claims.

DETAILED DESCRIPTION OF THE VARIOUS EMBODIMENTS

In the following description of the illustrated embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

Referring now in detail to the drawings, and in particular to FIG. 1, there is shown a multi-port programmable memory device 20 including a memory array 22 to which is coupled a number of ports for accessing the memory array 22. The programmable memory device 20 is intended to represent any type of programmable memory having multiple ports within which a global wiring management approach in accordance with the principles of the present invention may be implemented. It is to be understood that a multiple port programmable memory device 20 within the context of the present invention may be implemented in any memory technology, such as a CMOS technology or any other technology of programmable storage devices.

By way of example, the memory device illustrated in FIG. 1 may represent a scannable memory array 22, such as an LSSD (level sensitive scan design) memory array, to which a scan input/output port 24 may be coupled. An LSSD memory device is understood in the art to represent a memory implementation that provides for a comprehensive level of memory element or latch testing using scan-based testing techniques. A memory device designed in accordance with typical LSSD principles provides for a high degree of observability and controllability. Observability refers to the degree to which one can observe a particular node of internal circuitry at the outputs or pins of the circuit. Controllability refers to a measure of the ease by which a particular node of internal circuitry may be set to a 1 state or 0 state. It is to be understood that a global wiring management approach according to the present invention may be implemented in any scannable or non-scannable programmable memory device.

The multi-port programmable memory device 20 shown in FIG. 1 includes ports 1–10 coupled to memory array 22. In accordance with this illustrative embodiment, the memory device 20 includes five read ports, ports 1–5, and five write ports, ports 6–10, as well as a scan input/output port 24. The implications of providing multiple port access to memory cells defined within memory array 22 may be appreciated by referencing FIG. 2.

Figure 2:
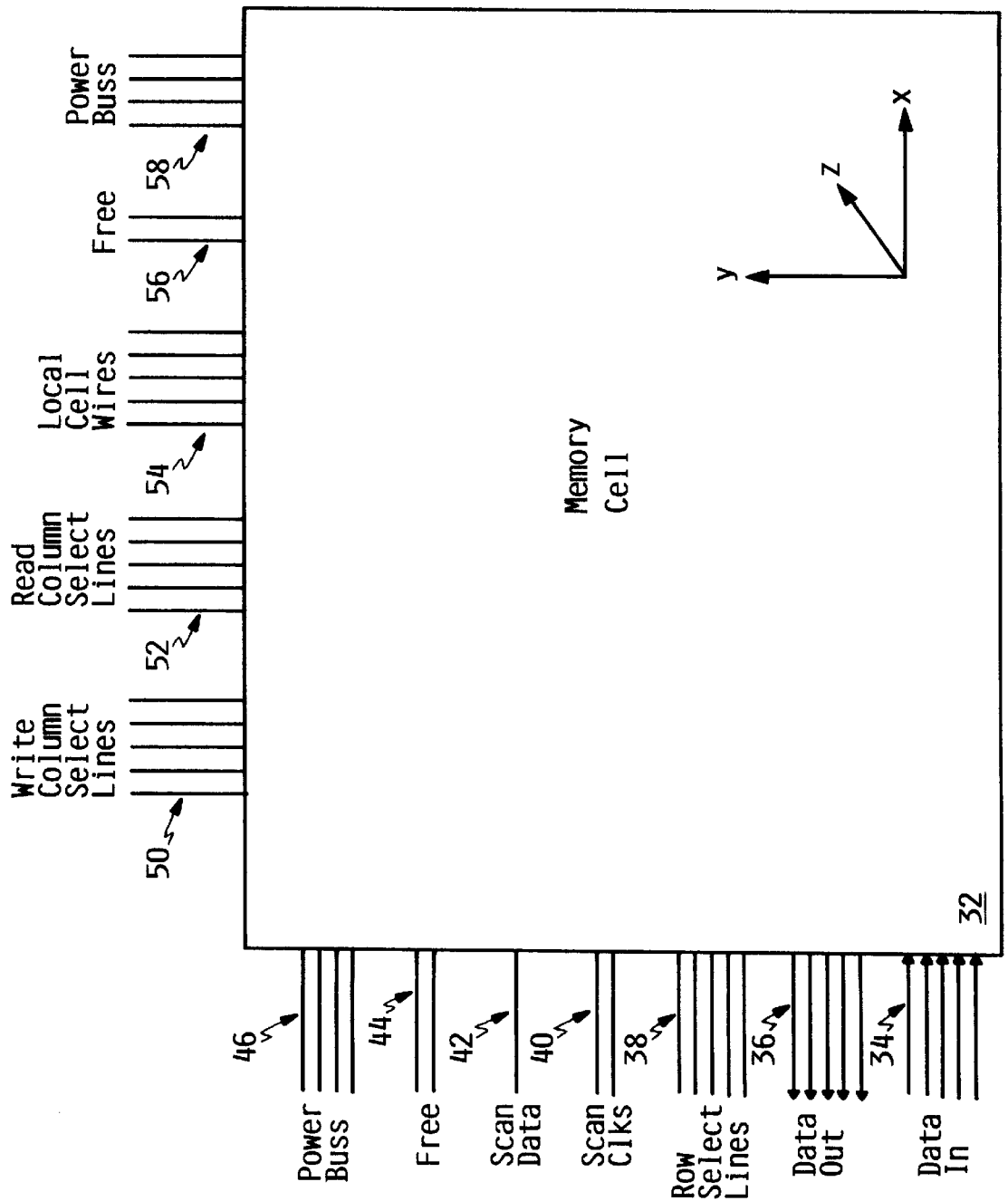
FIG. 2 is a depiction of a single memory cell of a multiple port programmable memory and its associated wiring configuration for facilitating multiple port access to the memory cell.

As is shown in the illustrative embodiment of FIG. 2, each memory cell 32 of memory array 22 is interconnected with ports 1–10 and scan input/output port 24 through a complex global wiring arrangement. It may be useful to view the wiring configuration that provides external access to memory cell 32 in terms of x, y, and z planes defining the three-dimensional memory cell 32. Running generally along the y-axis or vertical plane of memory cell 32 is a first set of global wires or conductors. A second set of global conductors runs generally along the x-axis or horizontal plane of memory cell 32.

The set of conductors running along the x-axis of memory cell 32 includes five data input lines 34 and five data output lines 36. The set of conductors running along the horizontal plane of memory cell 32 also includes write row select lines 38, scan clock lines 40, a scan data line 42, two free or unassigned lines 44, and four power bus lines 46. The set of conductors running along the y-axis or vertical plane of memory cell 32 includes five write column select lines 50 and five read column select lines 52. Other conductors running along the vertical plane of memory cell 32 include local cell conductors 54, a pair of free or unassigned conductors 56, and four power bus conductors 58.

It is understood that the horizontal and vertical conductors are typically oriented so as to be physically separated with respect to the z-axis of memory cell 32. It will be readily appreciated by those skilled in the art that a multi-port memory array which employs 24 horizontally oriented conductors and 25 vertically oriented conductors for interconnecting individual memory cells 32 presents several challenges to the circuit designer.

One particular challenge concerns the problem of adding additional ports to the memory array 22 while keeping the wiring area of each memory cell and the memory array to a minimum. It is well appreciated that the critical conductive paths that determine the overall performance of an integrated circuit, such as a random access memory array, are typically dominated by global wiring characteristics.

For example, increasing the speed of local circuits does not necessarily translate into faster overall operating speeds if global wire interconnections are not properly implemented. An imprudently designed global wiring implementation may limit overall circuit performance due to a number of factors, including increased capacitive loading, increased parasitic interconnection capacitance which may ultimately dominate total capacitance, increased line resistance, and increased power consumption, for example.

Increasing the number of memory array ports requires that the designer thoughtfully evaluate these and other global wiring considerations, while at the same time attempting to minimize the area of the memory array allocated for global wiring. For example, a particular cell layout for a multiple port memory array may necessitate that a certain number of wiring channels be provided for interconnecting the memory cell transistors. Because of the number of memory cell interconnect wires implicated in the cell layout, a conventional global wiring implementation would likely provide for a wiring area that exceeds the device area. Appropriate balancing of wiring area and device area thus represents a significant consideration when designing a multiple port programmable memory device.

A wiring channel, in the context of the present invention, is understood to represent a minimum size wire width, together with a minimum spacing with respect to adjacent wires. For example, a minimum wire size may be specified to have a width of 1 micron, and the minimum spacing to an adjacent wire may be specified at 1 micron. In this illustrative example, the wiring channel is specified to be a 2 micron wide wiring channel, which represents the summation of the minimum wire width and the minimum spacing.

Figure 3:
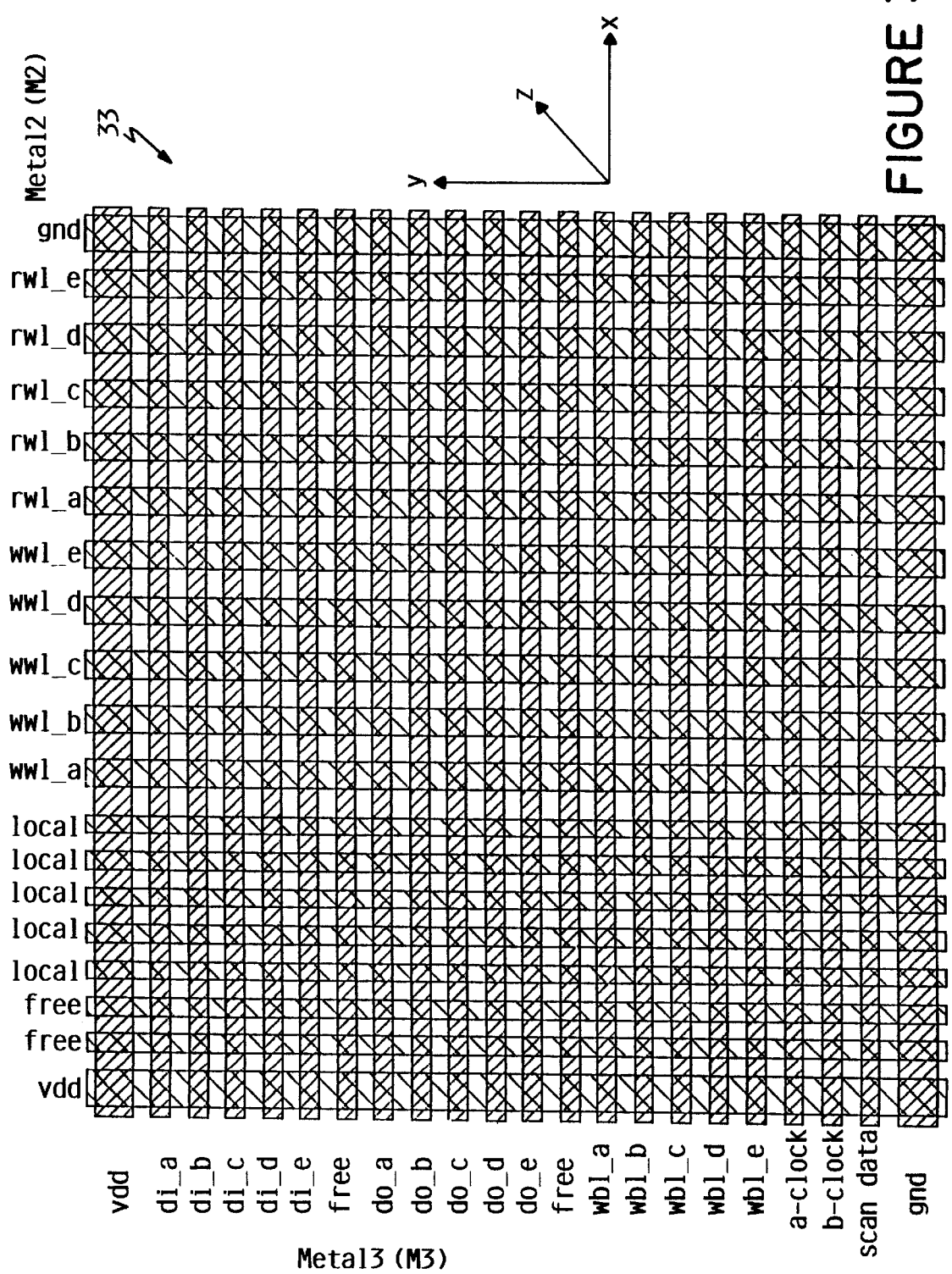
FIG. 3 illustrates two levels of metal interconnect in accordance with a conventional interconnect strategy for a memory cell of a multiple port random access memory.

FIG. 3 illustrates one embodiment of a memory cell of a multiple port random access memory array, such as the memory cell shown in FIG. 2. Memory cell 33 depicted 4n FIG. 3 is provided to illustrate the various interconnect levels, referred to as Metal 2 (M2) and Metal 3 (M3) interconnects, of the memory cell. The M2 and M3 metal interconnects represent signal-routing and power-routing layers provided above a local interconnect layer of memory cell 33. The M2 and M3 interconnect layers typically provide for the routing of logic signals and power signals between circuit elements or modules as part of the global wiring implementation of the programmable memory device.

The local interconnect layer is typically fabricated from a polysilicon, silicide, polycide, or salicide material and patterned to provide a layer for effecting intracell connections and routing. It is generally considered desirable to utilize the local interconnect to provide connectivity within cells, such as polysilicon-to-diffusion connections within the cell, so as to alleviate the need to use metal interconnects and contacts to effect local interconnections. The M1 interconnect layer represents an interconnect layer disposed above the local interconnect layer and is typically used for local wiring of closely situated circuit elements. The remaining M2 and M3 interconnect layers may be more effectively used to satisfy global wiring requirements.

The memory cell depicted in FIG. 3 is similar in configuration to that shown in FIG. 2. In particular, memory cell structure 33 shown in FIG. 3 includes five global M3 wires, di_a through di_e, running horizontally along the x-axis of memory cell 33. Five global M3 data output wires, do_a through do_e, also run horizontally along the x-axis of memory cell 33. The M3 interconnect layer also includes a double wide $V_{DD}$ bus, two free or unassigned interconnect wires, an a-clock wire and a b-clock wire, a scan data wire, and a double wide ground bus. In addition, the M3 interconnect layer includes five global write bit lines or write row select lines, wbl_a through wbl_e.

The Metal 2 interconnect layer illustrated in FIG. 3 includes five global write word lines or write column select lines, wwl_a through wwl_e, running generally vertically along the y-axis of memory cell 33. The M2 interconnect layer further includes five global read word lines or read column select lines, rwl_a through rwl_e, running vertically along the y-axis of memory cell 33. Other M2 interconnect wires include two free or unassigned wires, double wide $V_{DD}$ and double wide ground wires, and five local wires for effecting intracell routing.

It can be appreciated that a global wiring strategy for interconnecting an array of memory cells, such as those illustrated in FIGS. 2 and 3, may require an excessively large wiring area if imprudently implemented. As discussed previously, it is important to balance the wiring area and the device area so as to create a memory array as small as possible. As can be appreciated from the memory cell configurations depicted in FIGS. 2 and 3, the area required to implement global wiring for a memory array which provides for multiple port access can be substantial.

In a memory array having more than one read or write port, for example, the wiring area required to effect a conventional global wiring strategy can begin to exceed the device area. A global wire management approach in accordance with the principles of the present invention provides the required balance between wiring area and device area for programmable memory arrays having a substantial number of read and write ports.

The advantages realized by implementing a global wiring strategy consistent with the principles of the present invention will now be described in greater detail with reference to FIGS. 4A–4C and 5A–5B. FIG. 4A illustrates a global wiring specification for a memory cell substantially similar to that shown in FIGS. 2 and 3. In this illustrative embodiment, memory cell #1 shown in FIG. 4A represents a 10 port array having five read ports, five write ports, and a scan input/output port. Memory cell #1 includes 24 M3 interconnect wires running generally along the horizontal or x-axis of memory cell #1. The 24 M3 interconnect wires include five data input wires 34, five data output wires 36, five write bit or write row select lines 38, two scan clock wires 40, one scan data path wire 42, two free or unassigned wires 44, and four power bus wires 46, as is shown in FIG. 2.

Memory cell #1 shown in FIG. 4A further includes 25 M2 interconnect wires running generally vertically along the y-axis of the memory cell. The M2 interconnect wires include five write column select lines 50, five read column select lines 52, five local cell access wires 54, two free or unassigned wires 56, and four power bus wires 58. In this example, the five write column select lines 50 and five read column select lines 52 each represent fat wires each requiring 1.5 wiring channels (i.e., 5 WCSLs×1.5 wiring channels =7.5 wiring channels).

As is shown in FIG. 4A, memory cell #1 having the above-described wiring configuration requires 24 vertically oriented wiring channels and 25 horizontally oriented wiring channels to support a global wiring implementation for memory cell #1. Memory cell #1 may be viewed as having a cell size of 24×25 wiring channels or 600 sq. wiring channels. Importantly, the cell layout of memory cell #1, in terms of transistors, only requires 16 vertically oriented wiring channels and 30 horizontally oriented wiring channels for a total of 480 sq. wiring channels, as is shown in FIG. 4B.

Figure 4C:
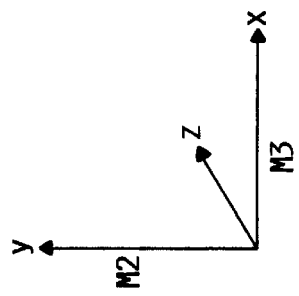
FIG. 4C illustrates the orientation of the M2 and M3 metal interconnect levels generally oriented along the y or vertical axis and the x or horizontal axis of the memory cell, respectively.
Figure 4B:
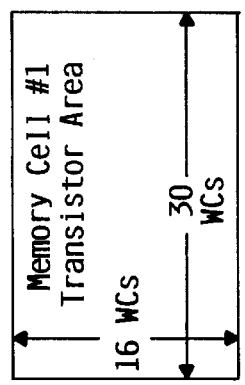
FIG. 4B illustrates a transistor area requirement for the memory cell shown in FIG. 4A which includes 16 wiring channels oriented along the vertical plane of the memory cell and 30 wiring channels oriented along the horizontal plane of the memory cell.
Figure 4A:
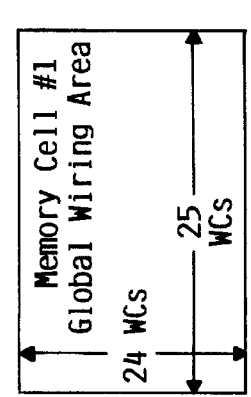
FIG. 4A is an illustration of a global wire area requirement for a single memory cell of a multiple port random access memory device including 24 wire channels oriented along a vertical plane of the memory cell and 25 wire channels oriented along a horizontal plane of the memory cell.

It can be seen from the illustrations in FIGS. 4A–4C that providing multiple port connectivity with the memory cell depicted in FIGS. 2 and 3 would result in an excessively large cell or device area in order to support a conventional global wiring implementation. In this illustrative example, a traditional global wiring approach would require a cell size of 600 sq. wiring channels when only 480 sq. wiring channels are necessitated by the transistor layout of memory cell #1.

A global wire management approach according to the present invention provides a global wiring strategy in which the wiring area is substantially reduced in comparison with a conventional global wiring approach. As will be demonstrated hereinbelow, the wiring area of a multiple port programmable memory cell may be reduced on the order of 20% by implementing a global wiring management approach in accordance with the principles of the present invention.

It can be seen from FIGS. 4A and 4B that the increases in wiring area due to global wiring requirements are most pronounced along the cell's vertical plane or M3 interconnect wires. In particular, the device area associated with memory cell transistor wiring requires only 16 vertically oriented wiring channels and 30 horizontally oriented wiring channels. Global wiring requirements, however, necessitate usage of 24 vertically oriented wiring channels, which represents eight wiring channels greater than the number of wiring channels required to facilitate the transistor wiring. It is noted that the 25 wiring channels required for global wiring can be readily accommodated by the 30 horizontally oriented wiring channels shown in FIG. 4B.

Figure 5B:
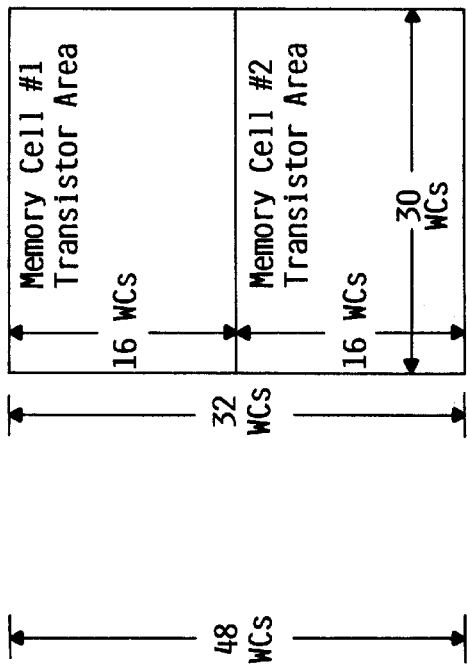
FIG. 5B illustrates a transistor area requirement for the memory cells shown in FIG. 5A and, in particular, illustrates the requirement to reduce the number of vertically oriented wire channels from 48, as shown in FIG. 5A, to a maximum of 32, as shown in FIG. 5B.
Figure 5A:
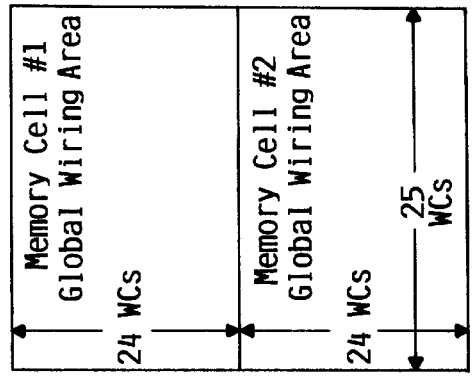
FIG. 5A illustrates stacking of two memory cells in accordance with a global wiring approach of the present invention.

FIG. 5A illustrates a typical global wiring scenario when viewing two adjacent memory cells of a memory array. The two memory cells may be arranged such that memory cell #2 is effectively a mirror image of memory cell #1 with respect to the x-axis. In this arrangement, the combined memory cells #1 and #2 have 48 vertically oriented wiring channels and 25 horizontally oriented wiring channels.

As is shown in FIG. 5B, the 25 horizontally oriented wiring channels of the dual memory cell can be accommodated by the 30 transistor wiring channels of the dual memory cell. It can be further seen, however, that the 48 vertically oriented wiring channels of the dual memory cell cannot be directly accommodated by the 32 vertically oriented transistor wiring channels shown in FIG. 5B. The challenge, therefore, is to reduce the number of the vertically oriented wiring channels from 48 to 32 in this illustrative embodiment.

Figure 6:
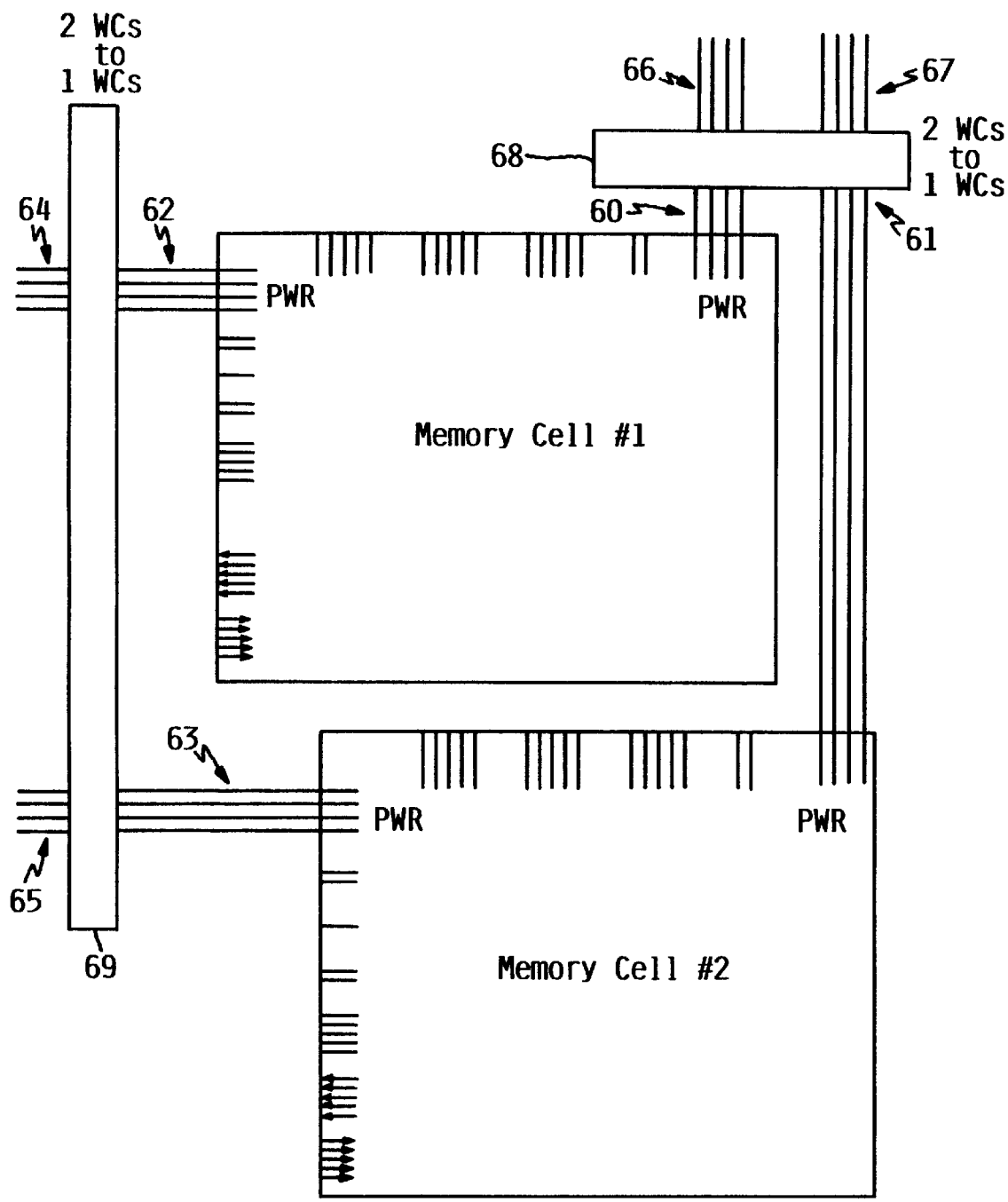
FIG. 6 illustrates stacking of two memory cells and sharing of power bus wire channels in accordance with a first global wiring optimization process step in accordance with the principles of the present invention.

FIG. 6 is an exaggerated illustration of two memory cells positioned in close proximity so as to form a generally stacked dual memory cell structure. Memory cell #2 has been offset with respect to memory cell #1 in the depiction of FIG. 6 for purposes of illustration. An initial step to reducing the number of wiring channels needed to support both global and transistor wiring requirements involves sharing of power busses between the stacked dual memory cell defined by memory cells #1 and #2, and between dual memory cells (not shown) situated adjacent to cells #1 and #2. The M2 power busses 60, 61 of memory cell #1 and #2 are respectively coupled to a shared power bus wiring channel 68. A corresponding pair of M2 power busses 66, 67 from an adjacent dual memory cell (not shown) are also coupled to shared power bus wiring channel 68.

In a similar manner, the M3 power busses 62, 63 of memory cell #1 and #2 are respectively coupled to a shared power bus wiring channel 69. The M3 power busses 64, 65 from an adjacent dual memory cell are also coupled to shared power bus wiring channel 69. It can be seen from FIG. 6 that sharing of a common power bus wiring channel between memory cells #1 and #2 reduces the number of power bus wiring channels from four to two. As such, the required number of global wiring channels is reduced from 48 to 46 by employment of this first global wiring optimization step. Further optimization is required to reduce the total number of global wiring channels from 46 to the required 32 wiring channels in accordance with this illustrative embodiment.

Figure 7:
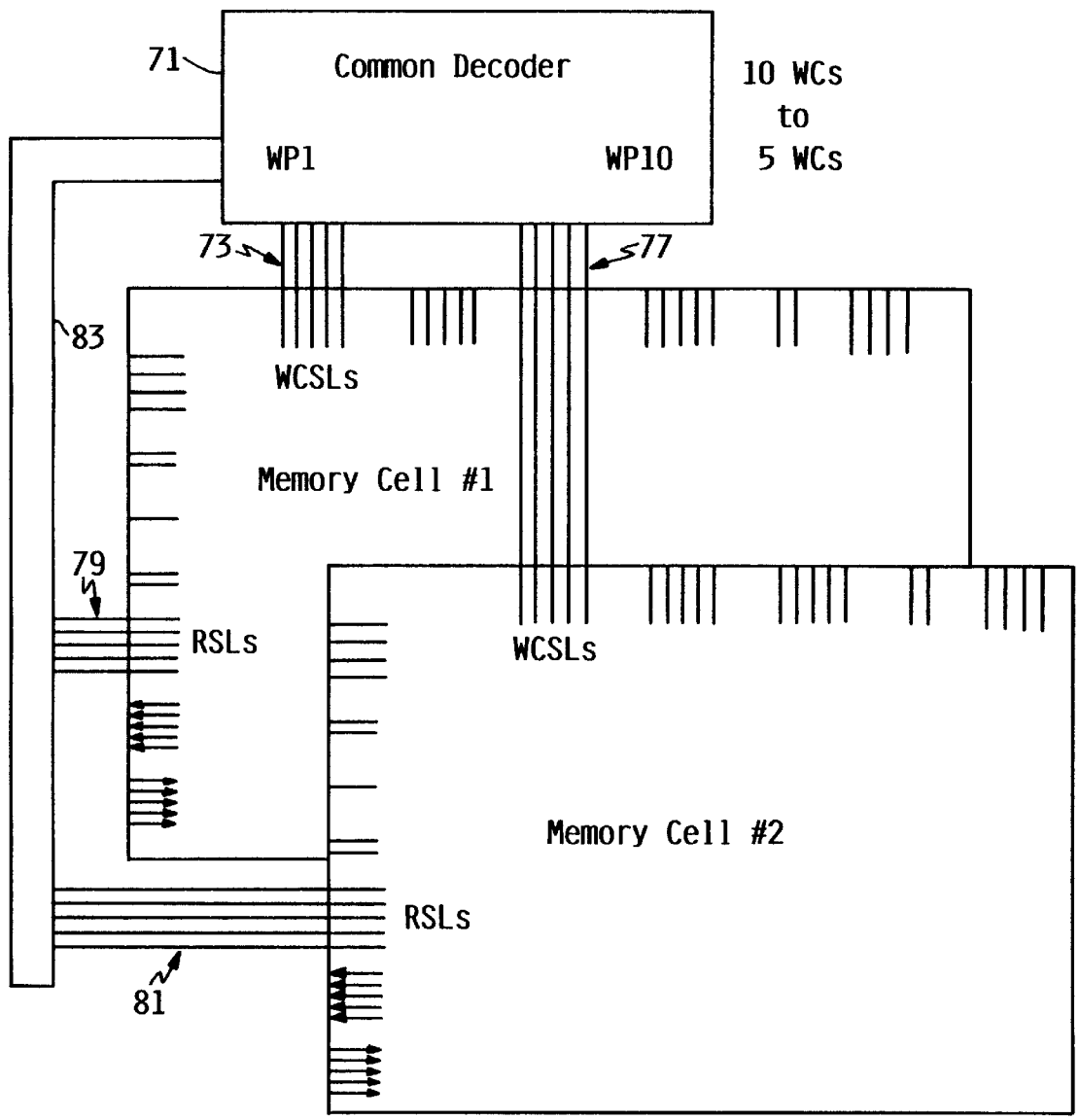
FIG. 7 illustrates an additional step in the global wiring optimization process for two stacked memory cells sharing a common decoder situated between memory cells in accordance with an embodiment of the present invention.

Another step towards optimizing a global wiring strategy for a multiple port random access memory concerns the implementation and utilization of a common decoder circuit 71 between memory cells #1 and #2, as is depicted in FIG. 7. Memory cell #2 and common decoder 71 have been offset with respect to memory cell #1 in the depiction of FIG. 7 for purposes of illustration. In order to reduce the number of intracell and global interconnect wires, it is desirable to use only one phase of the write column select line and only one phase of the write row select line. In order to generate the other phase for these lines, a local inverter is used to generate the other phases of the write column select and write row select lines, respectively.

The common decoder 71 shown in FIG. 7 advantageously employs an improved write port circuit which provides for the production of the required two phases of write column select and write row select line signals. The improved write port circuitry further provides for reduced capacitance at the input nodes of memory cells #1 and #2, and increased write speeds. In order to appreciate the advantages of an improved write port circuit in accordance with the principles of the present invention, it is useful to describe a traditional approach to implementing a write port for a multiple port random access memory.

Figure 8:
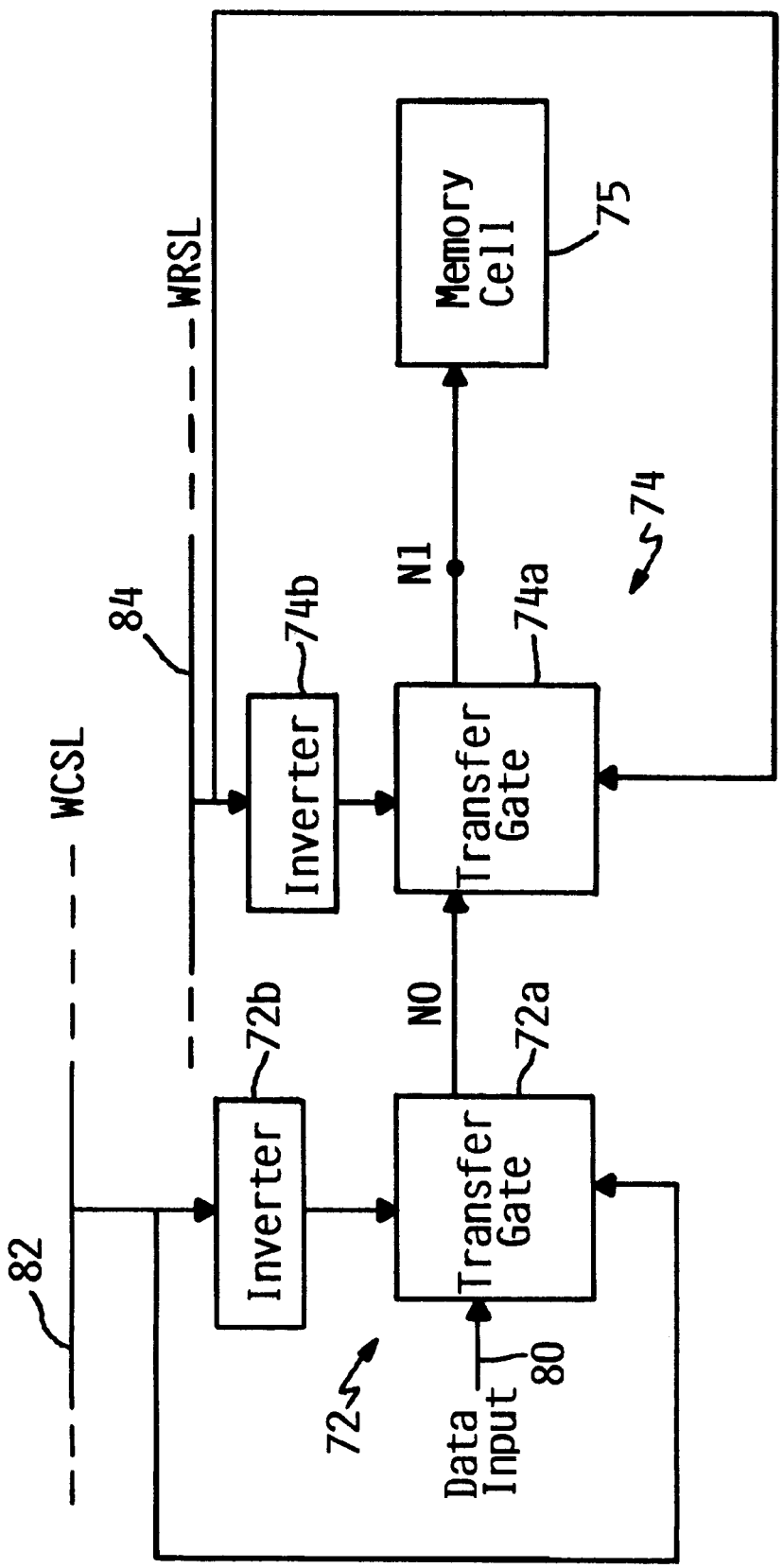
FIG. 8 illustrates the configuration of a conventional write port for writing data into a memory cell of a random access memory.
Figure 10:
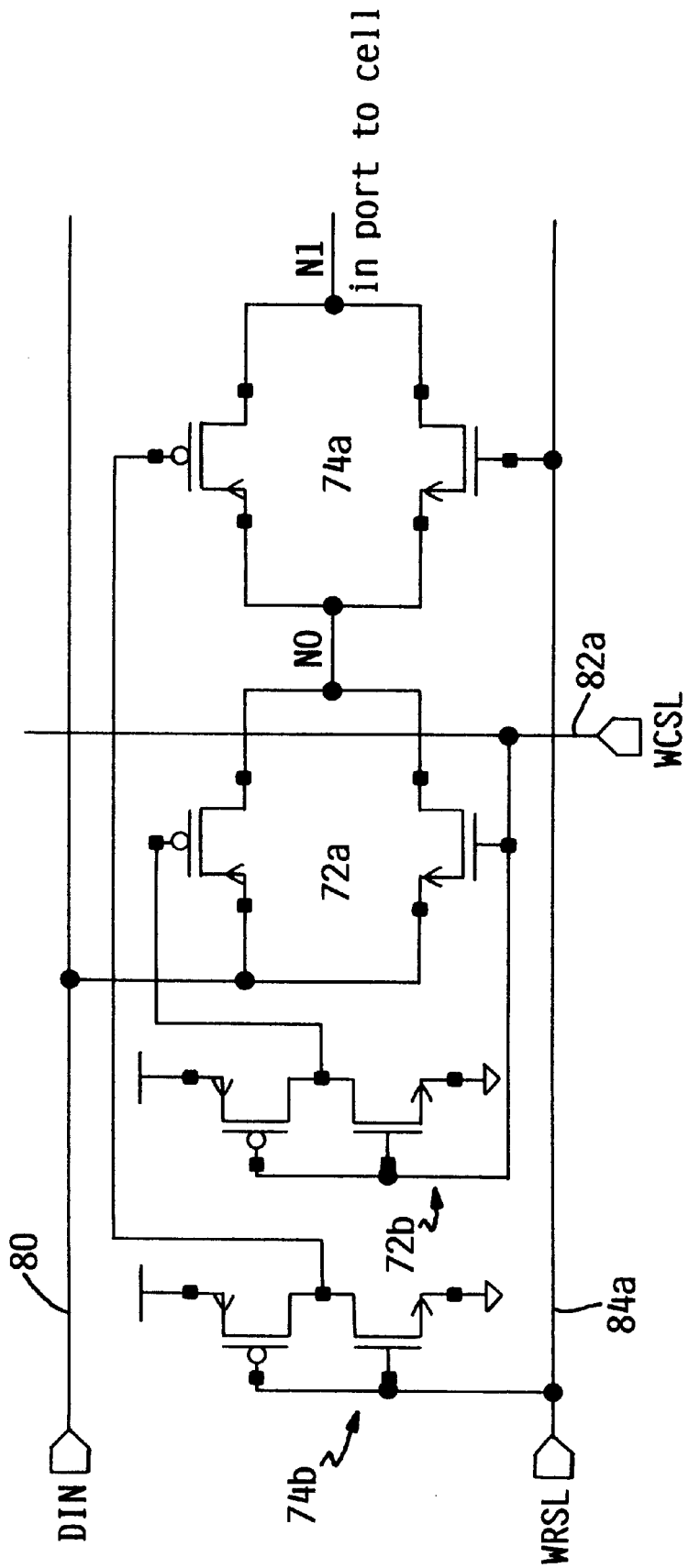
FIG. 10 illustrates an embodiment of conventional write port circuitry employing a pair of transfer gates and associated inverters for writing data to a memory cell of a random access memory.

The circuit block diagram depicted in FIG. 8 represents a traditional approach to implementing a write port for a scannable memory array, such as an LSSD memory device. FIG. 10 illustrates in schematic form the conventional write port circuit shown in FIG. 8. The implementation shown in FIGS. 8 and 10 includes two transfer gate circuits 72, 74 connected in series. Each of the transfer gate circuits 72, 74 of a conventional write port design includes a respective transfer gate 72a, 74a connected to an associated inverter 72b, 74b.

The first transfer gate circuit 72 is connected to write column select line (WCSL) 82, and the second transfer gate circuit 74 is connected to write row select line (WRSL) 84. A data line 80 is shown connected to an input of the first transfer gate circuit 72. Data received from data line 80 is transferred to memory cell 75 in response to the logic states of write row select line 84 and write column select line 82.

In accordance with a conventional approach, every write port coupled to memory array 22 includes the additional pair of transfer gates 72a, 74a and associated inverters 72b, 74b. Increasing the capacitance at node N1 concomitantly increases the difficulty of pulling node N1 from its current logic state to an opposite logic state. In order to do so, the cumulative capacitance at node N1 and the memory cell inverter thresholds must be overcome.

It is understood that two transfer gate circuits 72, 74 connected in series generally provides for poor conductance, and typically requires usage of relatively large transistors. Increasing the size of the transfer gate transistors, in turn, has the adverse affect of increasing the capacitance at node N1.

Another problem associated with a write port design associated with a traditional implementation concerns the speed at which data is written to the memory cell 75. For example, the entire active portion of the clock signal may be utilized to perform the operation of writing data to memory cell 75. In a more complex case in which a write through operation is desired, the speed at which memory cell 75 flips state becomes of significant importance.

In general, a desirable write port circuit implementation permits the memory cell 75 to flip state as fast as possible to make best use of the write through time available during the active portion of the clock signal. The speed at which memory cell 75 is able to flip state is a function of the capacitance at node N1 and the conductance of transfer gate circuits 72, 74. A traditional write port design, such as that illustrated in FIGS. 8 and 10, results in relatively high N1 node capacitance and poor transfer gate conductance, resulting in slower write speeds that may limit the efficacy of a given write through methodology.

In addition to the capacitance at node N1, the designer must be concerned with the capacitance at node N0 between transfer gate circuits 72, 74 of each write port. It can be seen that any time that transfer gate circuit 74 of a given write port is in an ON state, the capacitance at node N0 must be accounted for and added to the total capacitance of the write port circuitry. In addition to increased capacitance associated with a traditional write port design, the conventional write gate circuit implementation shown in FIGS. 8 and 10 is susceptible to unintended and erroneous flipping of states during a charge sharing event.

By way of example, it is assumed that for the previous cycle, all of the write column select lines 82 were ON, all of the write row select lines were OFF, and the data input to the transfer gate circuit 72 of all write ports was 0. In this case, the N0 nodes of all write ports are charged, or in this case discharged, to 0 volts. It is also assumed that the node N1 of memory cell 75 is at the potential $V_{DD}$. In the next cycle, it is assumed that the write row select line transitions to an ON state and the write column select line 82 transitions to an OFF state for all write ports so that all nodes N0 draw a charge from node N1. If this charge draw causes the voltage at node N1 to drop far enough, such a voltage drop will cause the memory cell 75 to flip state. It can be appreciated that such a charge sharing scenario is both undesirable and hazardous.

Figure 9:
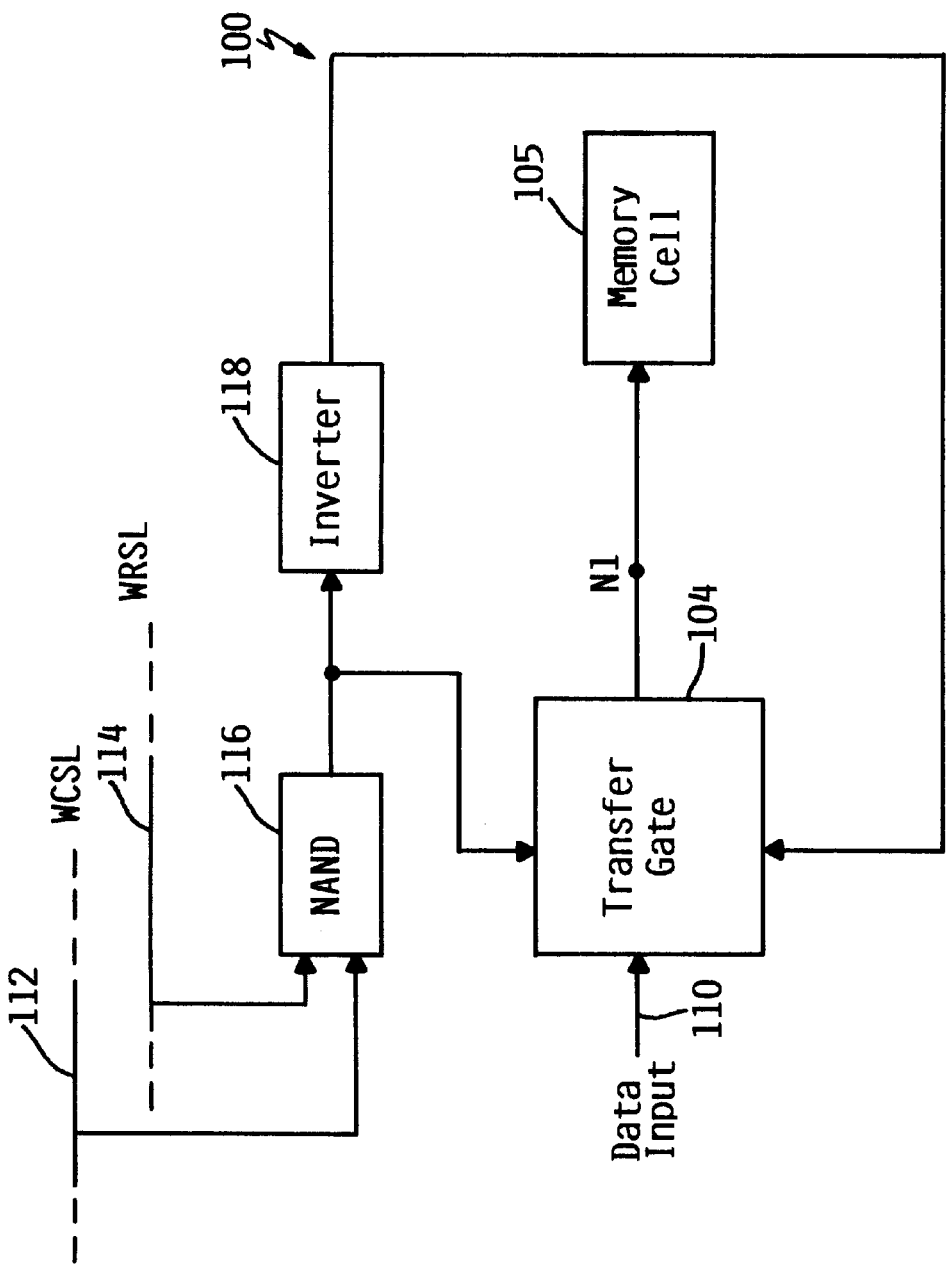
FIG. 9 is a block diagram of a write port for writing data to a memory cell of a programmable memory device in accordance with one embodiment of the present invention.

The above-described problems associated with traditional approaches to implementing a write port for a scannable memory array are obviated by implementing write port circuitry in accordance with the principles of the present invention. FIG. 9 illustrates in block diagram form an exemplary embodiment of a write port for a multiple write port programmable memory according to the present invention. In accordance with the embodiment shown in FIG. 9, a single transfer gate 104 is employed for each write port of a multiple write port random access memory. In addition to reducing the number of transfer gates of a conventional design from two to one, the number of inverters is reduced in number from two to one.

The write port circuit 100 shown in FIG. 9 includes a dual input NAND gate 116 with a first input coupled to write column select line 112 and a second input coupled to write row select line 114. The output of NAND gate 116 is coupled to an inverter 118 and to a first control input of transfer gate 104. The output of inverter 118 is coupled to a second control input of transfer gate 104. The transfer gate 104 has an input coupled to a data line 110. The output of transfer gate 104 is coupled to a memory cell 105.

The single transfer gate write port configuration, which includes NAND gate 116 and inverter 118, may be advantageously implemented for each write port of a multiple write port programmable memory apparatus. In an exemplary multiple port implementation, a number of the single transfer gate write ports 100 are coupled to node N1 at the input of the memory cell 105 to provide multiple write access to the memory cell 105.

Replacing the two series transfer gates 72a, 74a with a single transfer gate 104 of reduced size significantly reduces the capacitance at node N1 at the input of memory cell 105. Further, a write port implemented in accordance with the principles of the present invention completely eliminates the aforementioned charge sharing problem associated with prior art write port designs.

Figure 11:
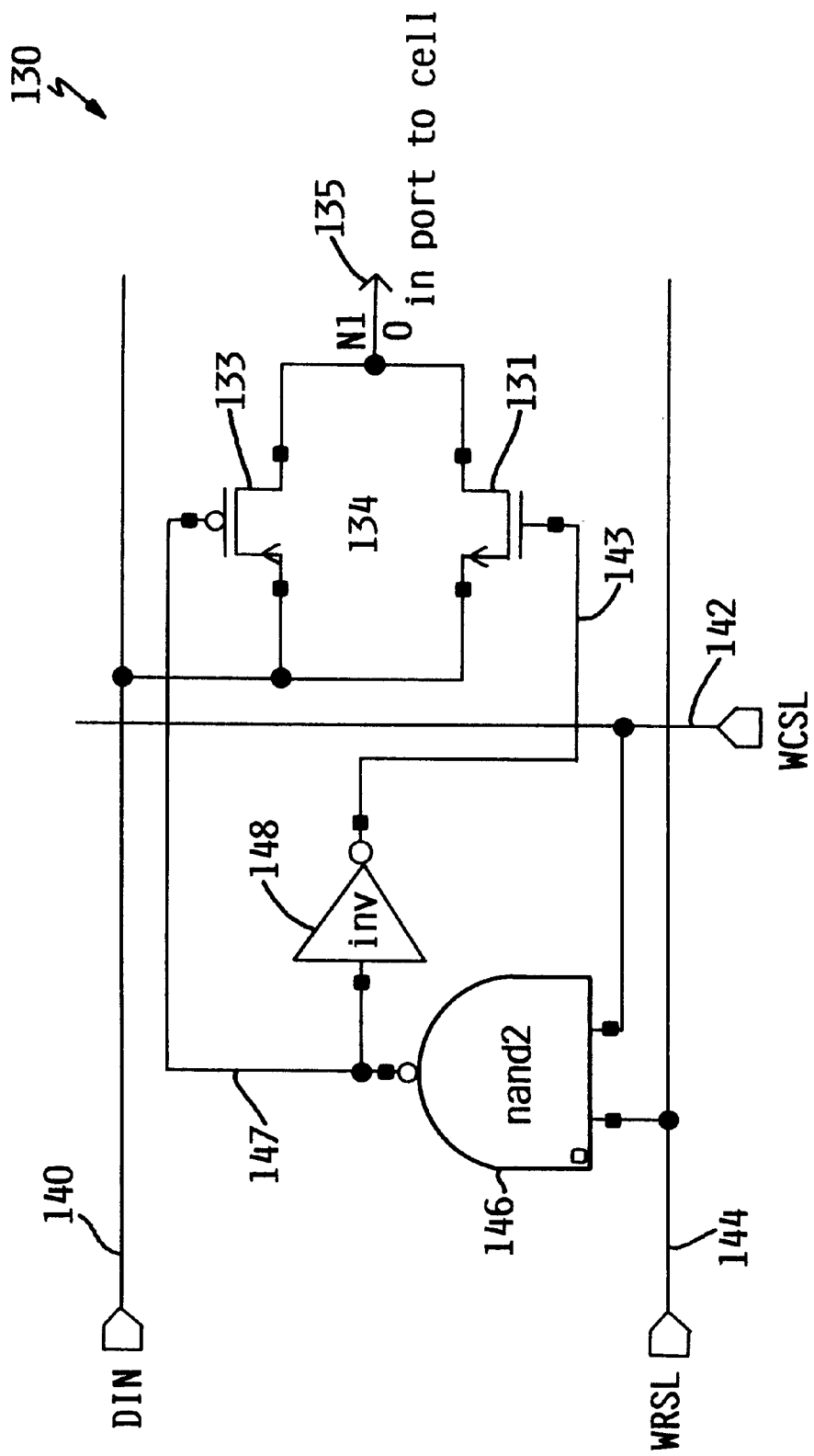
FIG. 11 is a block diagram of an improved write port for writing data to a memory cell of a programmable memory device in accordance with one embodiment of the present invention, which is particularly useful when incorporated into the common decoder shown in FIG. 7.

FIG. 11 is a schematic depiction of the write port circuitry shown in FIG. 9. As is shown in FIG. 11, the write port circuitry 130 includes a dual input NAND gate 146 having first and second inputs coupled to write row select line (WRSL) 144 and write column select line (WCSL) 142, respectively. The output of NAND gate 146 is coupled to the input of inverter 148 and to the gate of P-channel transistor 133 via conductor 147. The output of NAND gate 146 is also coupled to the input of inverter 148 which, in turn, is coupled to the gate of N-channel transistor 131 via conductor 143.

In the configuration illustrated in FIG. 11, the P-channel transistor 133 and N-channel transistor 131 constitute a CMOS transmission gate. The signal produced at the output of NAND gate 146 may be viewed as a control signal that controls the operation of the transmission gate 134. In particular, the control signal, and its complement produced at the output of inverter 148, are respectively applied to the gates of transistors 133 and 131 in response to the logic state of write row select line 144 and write column select line 142.

It can be seen that the write port circuitry 130 shown in FIG. 11 initiates writing of data from data line 140 to the memory cell (not shown) at the output of transmission gate 134 in response to a high logic state applied to both write row select line 144 and write column select line 142. The logic state of the memory cell remains unchanged in response to NAND gate inputs other than high logic level inputs applied to the NAND gate 146.

Figure 12:
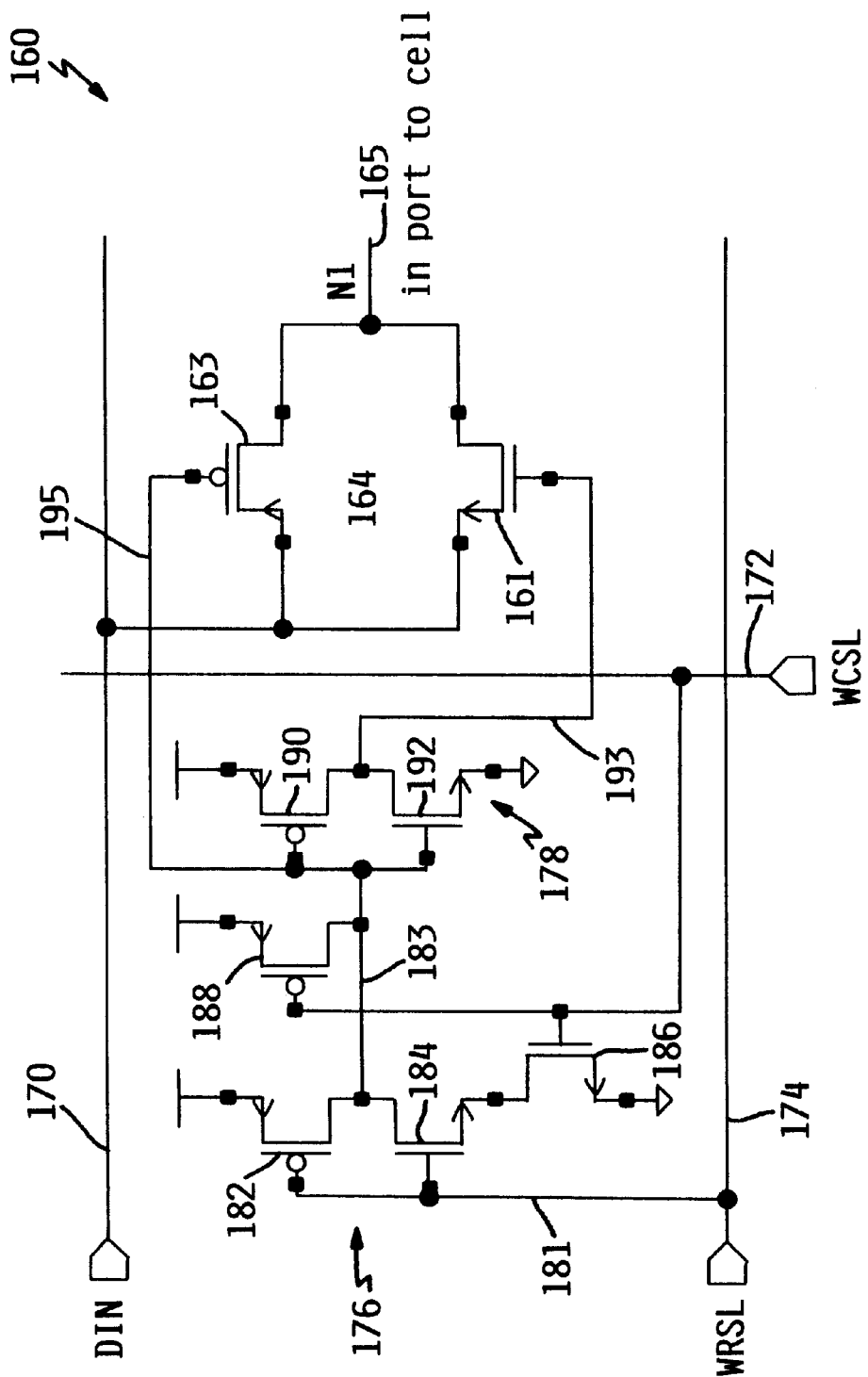
FIG. 12 is a schematic illustration of an improved write port circuit for writing data to a memory cell of a programmable memory device in accordance with another embodiment of the present invention.

Another embodiment of write port circuitry in accordance with the principles of the present invention is illustrated in the schematic illustration provided in FIG. 12. In this embodiment, NAND gate 176 is implemented using two P-channel MOSFET transistors 182, 188 and two N-channel MOSFET transistors 184, 186. The inverter 178 is implemented using one P-channel MOSFET transistor 190 and a single N-channel MOSFET transistor 192. By comparing the prior art write port circuitry shown in FIG. 10 with the write port circuitry of the present invention shown in FIG. 12, it can be seen that the advantages realized by implementing a write port according to the present invention are achieved with no net increase in the number of transistors needed to implement the write port circuit 160.

More specifically, the conventional twin transfer gate implementation shown in FIG. 10 requires two transistors for each transfer gate 72a, 74a. In addition, each of the inverters 74b and 72b is implemented using two transistors. As such, the conventional write port circuit shown in FIG. 10 requires a total of eight transistors per write port. Turning to FIG. 12, the write port circuit 160 in accordance with one embodiment of the present invention includes a single transfer gate 164 implemented using two transistors 163, 161. The inverter 178 includes two transistors 190, 192. In addition, the NAND gate 176 includes four transistors 182, 184, 186, 188. As such, a total of eight transistors are employed to implement the circuitry 160 for each write port.

Returning to FIG. 7, the common decoder 71 accommodates the write column select line and write row select line decoder requirements for each of the two memory cells #1 and #2 of the stacked dual memory cell. Employing a common decoder 71 between memory cells #1 and #2 advantageously provides for the reduction of write row select lines from ten lines to five lines. The total number of required global wiring channels may thus be reduced by 5 wiring channels through employment of common decoder 71 between memory cells #1 and #2. It is noted that the single transfer gate circuit shown in FIG. 9 is typically needed for each of the write ports WP1–WP10 of the common decoder 71. After completing this optimization step, the number of global wiring channels is further reduced from 46 to 41. The additional steps discussed below further reduce the number of global wiring channels in order to satisfy vertical height requirements.

Figure 13:
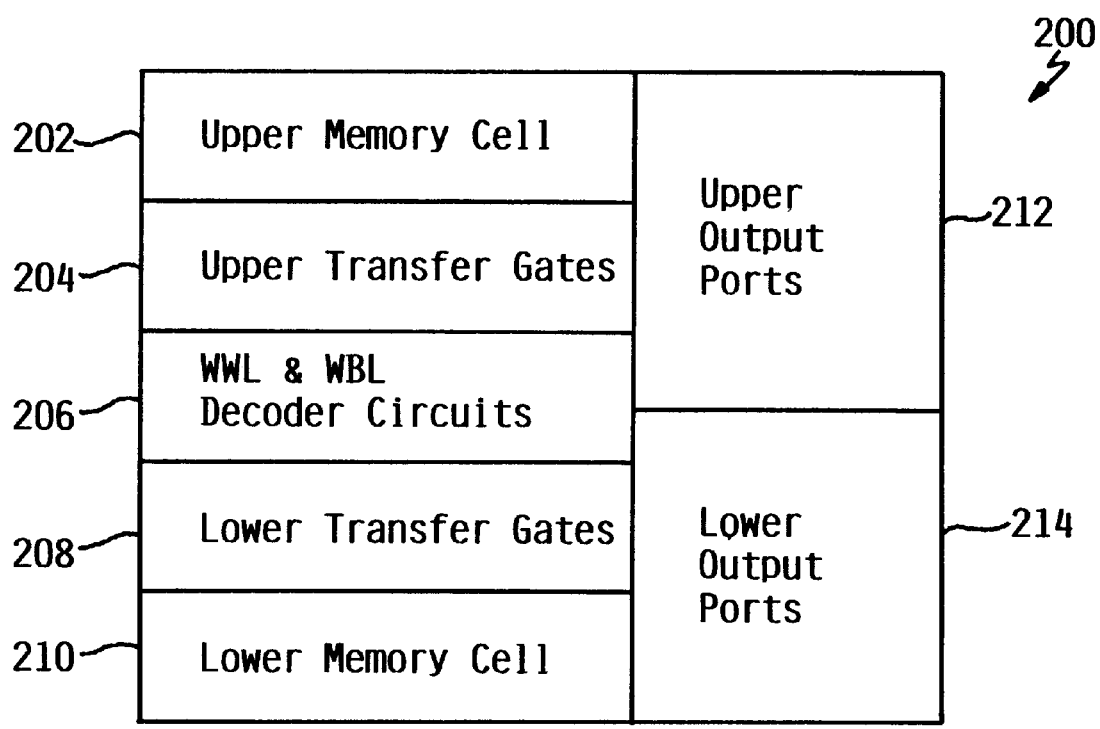
FIG. 13 is a floor plan of a stacked dual memory cell structure in accordance with an embodiment of the present invention in which common decoder circuitry is disposed between upper and lower stacked memory cells.

FIG. 13 illustrates an embodiment of a stacked dual memory cell configuration having a common decoder disposed therebetween. By employing a common decoder shared between two adjacently oriented memory cells, the decoder circuit may be situated internally within the dual memory cell structure. In one configuration, as is shown in FIG. 13, the decoder circuits 206 are oriented vertically in the middle of the dual memory cell structure and adjacent to upper transfer gates 204 and lower transfer gates 208.

Because the common decoder circuit 206 is oriented vertically in the middle of the dual memory cell 200, the true and complement decoder outputs may be fed upwards and downwards to the upper and lower transfer gates 204 and 208, respectively, using the M2 interconnect layer. By way of example, and with reference to FIG. 12, the true and complement decoder outputs may be coupled to the control signal inputs of the transfer gates 163, 161 through conductors 193 and 195, respectively.

An upper memory cell 202 is situated adjacent the upper transfer gates 204, and a lower memory cell 210 is situated adjacent the lower transfer gates 208. Upper output ports 212 are situated adjacent to each of the upper memory cell 202, upper transfer gates 204, and common decoder circuits 206. The lower output ports 214 are situated adjacent each of the lower memory cells 210, lower transfer gates 208, and common decoder circuits 206.

The dual cell configuration illustrated in FIG. 13 advantageously provides for wiring of the upper and lower transfer gates 204, 208 entirely at the local interconnect layer. As such, one can run some of the horizontal global wires on M1 over the transfer gate circuits instead of on M3. In this configuration, the M1 interconnect layer need not be used to effect the required wiring of the upper and lower transfer gate circuitry. This results in a total reduction in M3 wiring utilization from 41 wires to 31 wires.

Accordingly, the global wiring optimization approach in accordance with this illustrative embodiment provides for only 10 M1 interconnect wires and 31 M3 interconnect wires, for a total of 41 interconnect wires for the stacked dual memory cell. It can be seen, therefore, that only 31 vertically oriented wiring channels need be used to provide the requisite number of global wiring interconnections with the M3 interconnect wires of the dual memory cell.

Figure 14:
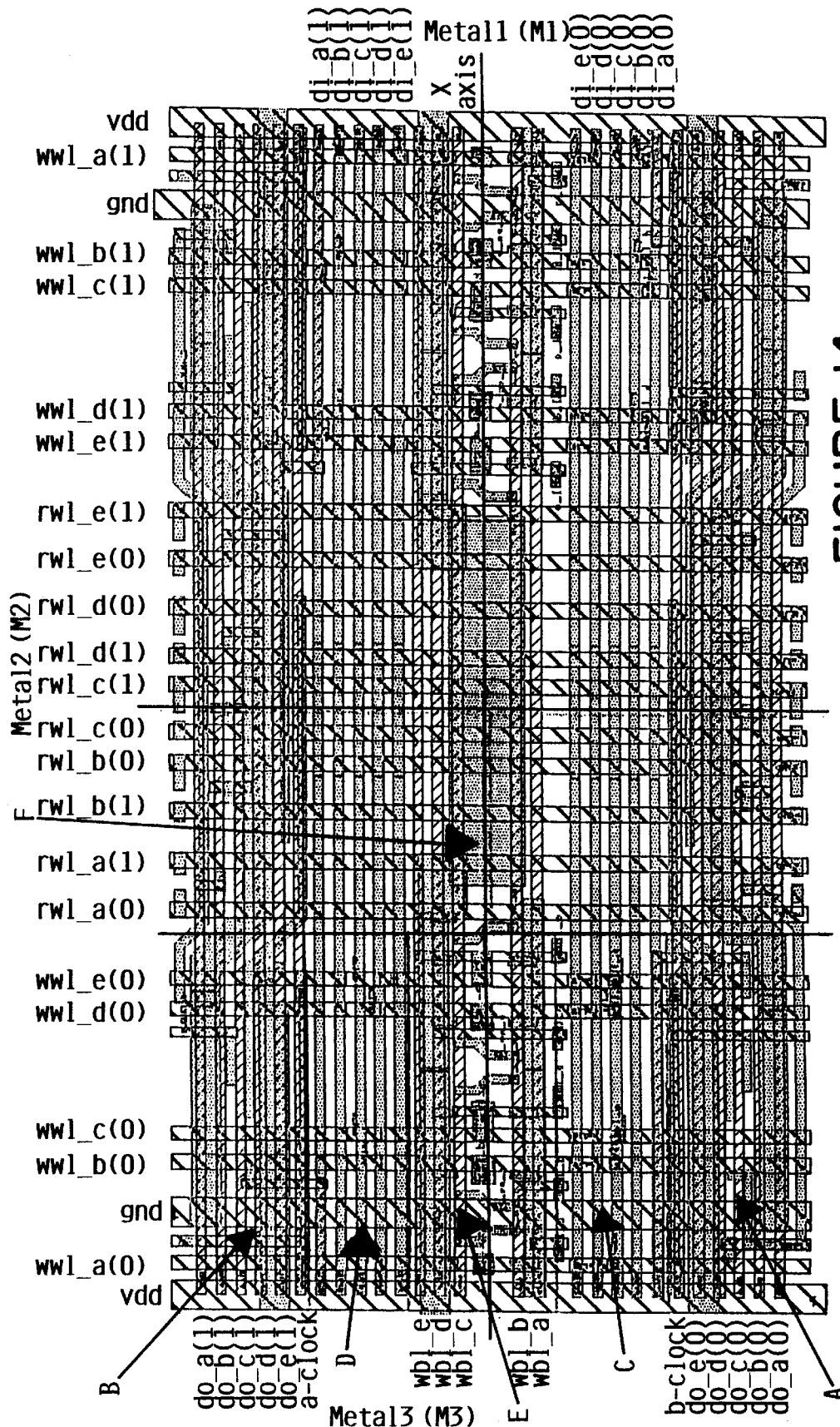
FIG. 14 is a three-level metal interconnect depiction of four memory cells interconnected in accordance with a global wiring arrangement of the present invention.

FIG. 14 provides a symbolic layout representation of four memory cells arranged as a pair of dual memory cells sharing various wiring channels in accordance with a global wiring management approach of the present invention. FIG. 14 illustrates the M1, M2, and M3 interconnect layers of the tandem stacked dual memory cell structure. Various regions of interest located on the left side of the central y-axis include Regions A and B, within which reside a first memory cell and a second memory cell of a dual memory cell structure.

Region C indicates the location of a first set of transfer gates associated with the first memory cell in Region A. Region D indicates the location of a second set of transfer gates associated with the second memory cell in Region B. The first and second set of transfer gates in Regions C and D are respectively interconnected using only the local interconnect layer.

A region of particular interest is Region E, which is the location of the decoder circuits and the write row select lines shared between the first and second memory cells in Regions A and B. The shared write row select lines in Region E are connected to the write port decoders which, in turn, are respectively connected to the first and second transfer gates in Regions C and D. Region F indicates the location of the upper and lower output or read ports.

Figure 15:
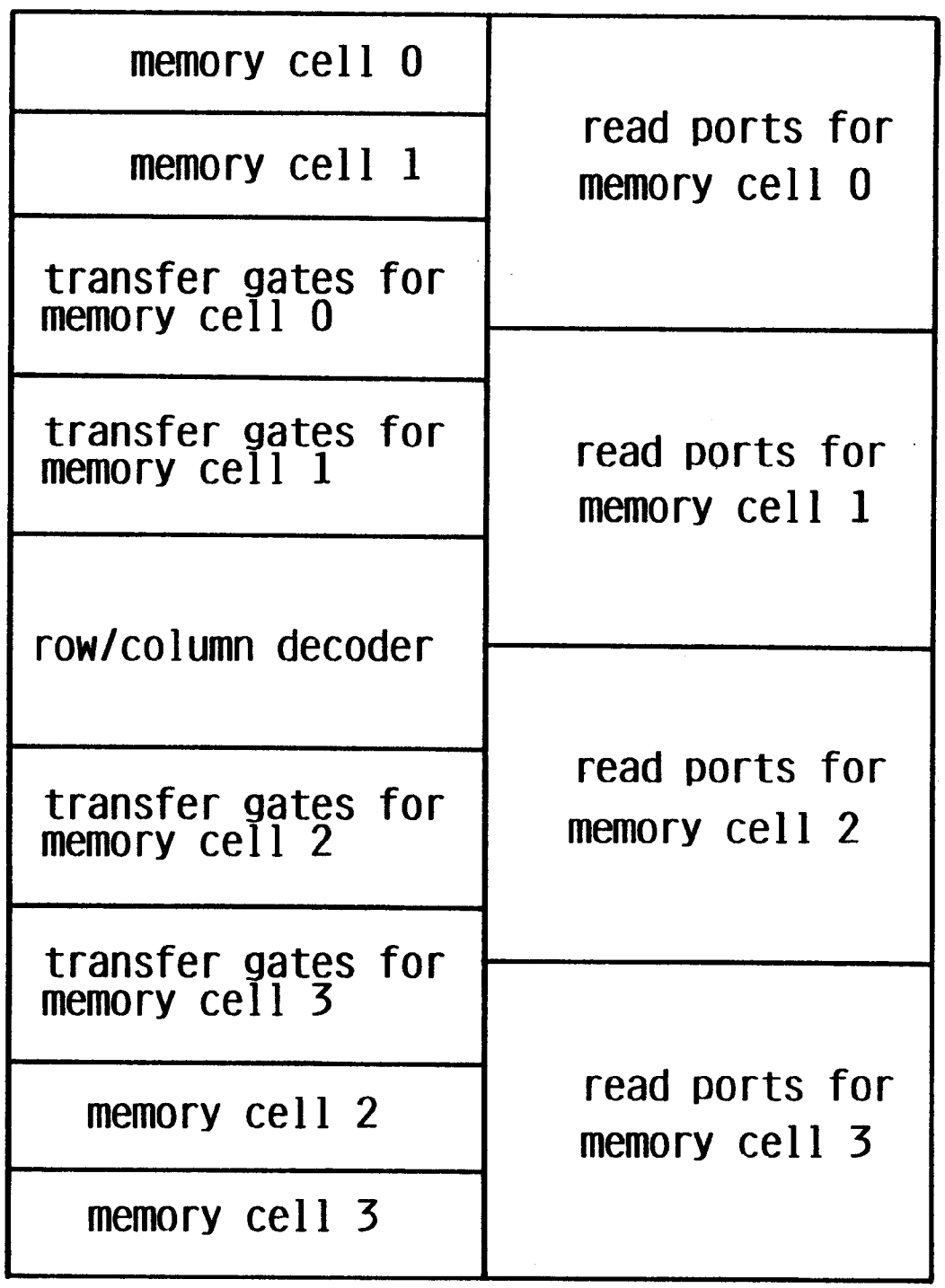
FIG. 15 is a floor plan of a multiple memory cell structure in which four memory cells share a common decoder circuit.

FIG. 15 is a floor plan of a multiple memory cell structure in which four memory cells share a common row/column decoder circuit. In accordance with the embodiment illustrated in FIG. 15, four memory cells, cells 0–3, are coupled to respective transfer gate circuits. A common row/column decoder circuit is coupled to the respective transfer gate circuits, and to global write column select lines and shared write row select lines.

Figure 16:
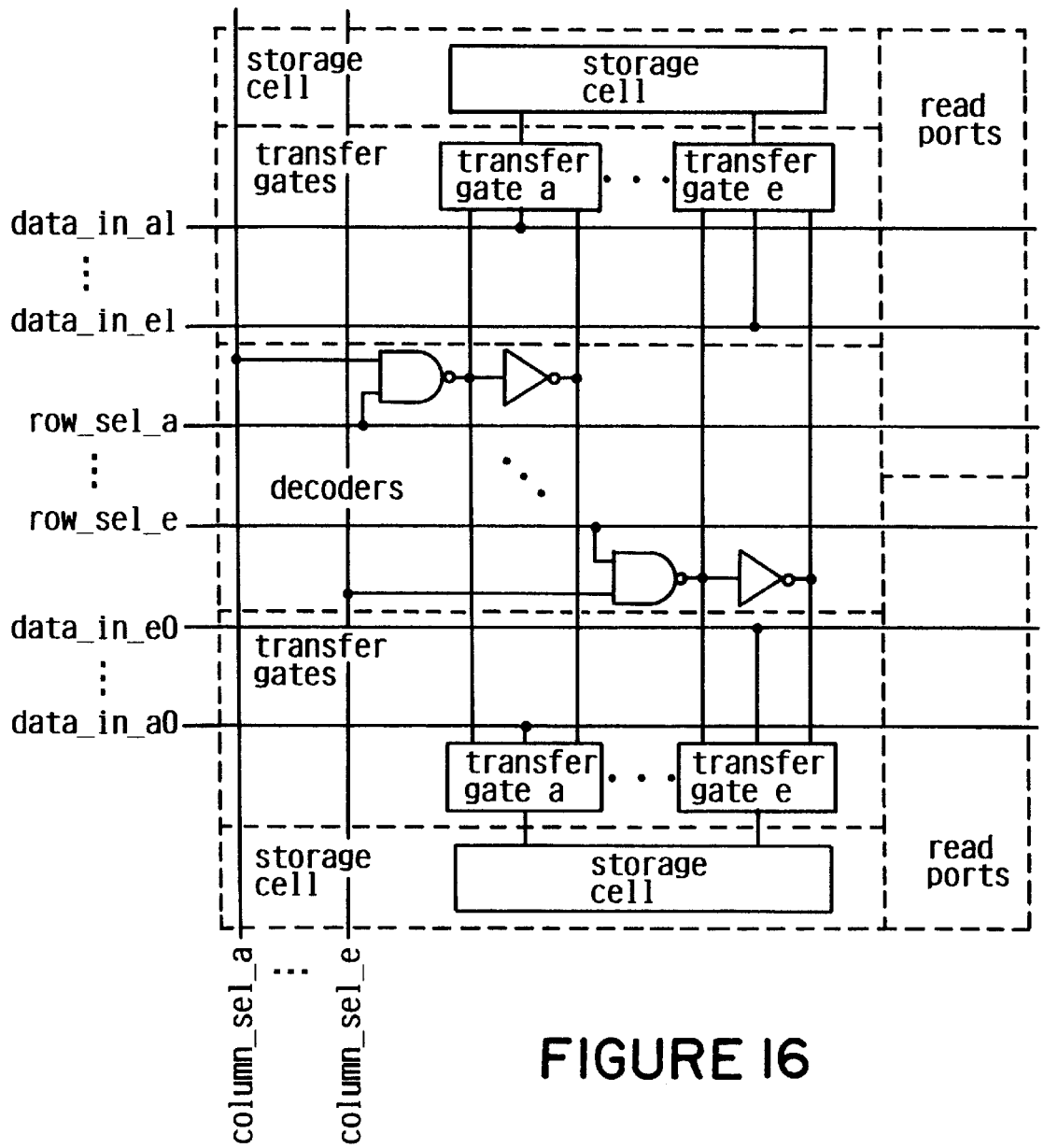
FIG. 16 is a schematic representation of the circuitry depicted in FIG. 13.

FIG. 16 illustrates in schematic form a number of write port decoders, such as those shown in Region 206 of the memory array portion illustrated in FIG. 13. Each of the write ports decoders is shared between two memory cells of the memory array. FIG. 16 also schematically shows the transfer gates and their associated memory cells, which are depicted as Regions 204, 208, 202, and 210 in FIG. 13.

In general, the global wiring management methodology described hereinabove provides an approach to reducing the number of interconnect wires in a multiple port random access memory cell. By sharing various signals between memory cells and employing a well-considered interconnection strategy, the shared wiring channel configuration makes it possible to move a number of the memory cell signal interconnects from the global wiring plane to the local wiring plane, thus allowing for the reduction in cell area to a device area-limited design, as opposed to a wiring-limited design.

The foregoing description of the various embodiments of the invention has been presented for the purposes of illustration and description. It is not intended to be exhaustive or to limit the invention to the precise form disclosed. Many modifications and variations are possible in light of the above teaching. For example, the orientation of the memory array and the memory cells defined therein may differ from that depicted in the figures. The global interconnect lines employed to interconnect the memory cells of the memory array need not be the substantially orthogonal write row select lines and write column select lines depicted in the figures. The present invention may be employed in any memory comprising a plurality of memory cells arranged in any configuration. It is intended that the scope of the invention be limited not by this detailed description, but rather by the claims appended hereto.

What is claimed is:

1. A multiple port programmable memory apparatus including a memory array, the memory array comprising a plurality of memory cells, the apparatus comprising:

a first memory cell of the memory array;

a second memory cell of the memory array;

an interconnect including a plurality of write row select lines, a plurality of write column select lines, and a plurality of data input lines;

a plurality of first transfer gates, each of the first transfer gates coupled to the first memory cell and one of the plurality of data input lines;

a plurality of second transfer gates, each of the second transfer gates coupled to the second memory cell and one of the plurality of data input lines; and a decoder circuit disposed substantially between the first and second memory cells and comprising a plurality of write port decoders, each of the write port decoders having an input coupled to a respective one of the plurality of write row select lines and write column select lines, and an output coupled to a respective one of the plurality of first and second transfer gates such that the write row select lines are shared between the first and second memory cells.

2. The apparatus of claim 1, wherein the first and second memory cells are coupled to a shared power bus.

3. The apparatus of claim 1, wherein each of the plurality of write port decoders comprises a NAND gate coupled to an inverter.

4. The apparatus of claim 1, wherein each of the first and second transfer gates comprises a first control input and a second control input, and each of the plurality of write port decoders comprises:

a NAND gate having a first input coupled to one of the plurality of write row select lines, a second input coupled to one of the plurality of write column select lines, and an output coupled to the first control input of a respective one of the plurality of first and second transfer gates; and an inverter having an input coupled to the output of the NAND gate and an output coupled to the second control input of the respective one of the plurality of first and second transfer gates.

5. The apparatus of claim 4, wherein the NAND gate comprises four transistor, the inverter comprises two transistors, and each of the first and second transfer gates comprises 2 transistors.

6. The apparatus of claim 4, wherein the NAND gate, the inverter, and each of the first and second transfer gates are respectively implemented in a complimentary metal-oxide semiconductor technology.

7. The apparatus of claim 1, wherein the interconnect comprises a local interconnect layer and a first interconnect layer disposed above the local interconnect layer, the first and second transfer gates respectively interconnected using only the local interconnect layer.

8. The apparatus of claim 1, wherein the first and second memory cells are implemented as scannable or non-scannable memory cells.

9. The apparatus of claim 1, wherein the programmable memory apparatus further comprises at least one scan input/output port.

10. The apparatus of claim 1, wherein the programmable memory apparatus further comprises at least one read port.

11. The apparatus of claim 1, wherein the decoder circuit comprises at least five write port decoders.

12. The apparatus of claim 1, wherein each of the first and second memory cells comprises a static random access memory cell or a dynamic random access memory cell.

13. A multiple port programmable memory apparatus including a memory array, the apparatus comprising:

a first memory cell of the memory array;

a second memory cell of the memory array;

an interconnect including a plurality of write row select lines, a plurality of write column select lines, and a plurality of data input lines; and a decoder circuit having an output coupled to each of the first and second memory cells, and an input coupled to the write row select lines and the write column select lines such that the write row select lines are shared between the first and second memory cells.

14. The apparatus of claim 13, wherein the decoder circuit comprises a plurality of write port decoders, each of the write port decoders having an input coupled to a respective one of the plurality of write row select lines and write column select lines, and an output coupled to each of the first and second memory cells.

15. The apparatus of claim 13, wherein the apparatus further comprises:
   a plurality of first transfer gates, each of the first transfer gates coupled to the first memory cell and one of the plurality of data input lines; and
   a plurality of second transfer gates, each of the second transfer gates coupled to the second memory cell and one of the plurality of data input lines; and
   the decoder circuit comprises a plurality of write port decoders, each of the write port decoders having an input coupled to a respective one of the plurality of write row select lines and write column select lines, and an output coupled to a respective one of the plurality of first and second transfer gates.

16. The apparatus of claim 13, wherein the decoder circuit is disposed substantially between the first and second memory cells.

17. The apparatus of claim 13, wherein the first memory cell, the second memory cell, and the decoder circuit are arranged in a substantially stacked configuration, the decoder circuit disposed substantially between the first and second memory cells.

18. The apparatus of claim 13, wherein each of the first and second memory cells comprises a static random access memory cell or a dynamic random access memory cell.

19. The apparatus of claim 13, wherein the first and second memory cells are coupled to a shared power bus.

20. The apparatus of claim 13, wherein the decoder circuit comprises a plurality of write port decoders, and each of the plurality of write port decoders comprises a NAND gate coupled to an inverter.

21. The apparatus of claim 13, further comprising:
   a plurality of first transfer gates, each of the first transfer gates coupled to the first memory cell and one of the plurality of data input lines; and
   a plurality of second transfer gates, each of the second transfer gates coupled to the second memory cell and one of the plurality of data input lines, each of the first and second transfer gates comprising a first control input and a second control input, and the decoder circuit comprising a plurality of write port decoders, each of the plurality of write port decoders comprising:
      a NAND gate having a first input coupled to one of the plurality of write row select lines, a second input coupled to one of the plurality of write column select lines, and an output coupled to the first control input of a respective one of the plurality of first and second transfer gates; and
      an inverter having an input coupled to the output of the NAND gate and an output coupled to the second control input of the respective one of the plurality of first and second transfer gates.

22. The apparatus of claim 21, wherein the NAND gate comprises four transistors, the inverter comprises two transistors, and each of the first and second transfer gates comprises 2 transistors.

23. The apparatus of claim 21, wherein the NAND gate, the inverter, and each of the first and second transfer gates are respectively implemented in a complimentary metal-oxide semiconductor technology.

24. The apparatus of claim 13, wherein the interconnect comprises a local interconnect layer and a first interconnect layer disposed above the local interconnect layer, the first and second transfer gates respectively interconnected using only the local interconnect layer.

25. The apparatus of claim 13, wherein the first and second memory cells are implemented as scannable or non-scannable memory cells.

26. The apparatus of claim 13, wherein the programmable memory apparatus further comprises at least one scan input/output port.

27. The apparatus of claim 13, wherein the programmable memory apparatus further comprises at least one read port.

28. The apparatus of claim 13, wherein the decoder circuit comprises at least five write port decoders.

29. The apparatus of claim 13, further comprising:
   a third memory cell of the memory array; and
   a fourth memory cell of the memory array, wherein:
      the output of the decoder circuit is coupled to each of the first, second, third, and fourth memory cells, and the input is coupled to the write row select lines and the write column select lines such that the write row select lines are shared between the first, second, third, and fourth memory cells.

30. The apparatus of claim 13, wherein the memory array comprising a plurality of memory cells in addition to the first and second memory cells, further wherein:
   the output of the decoder circuit is coupled to the first memory cell, second memory cell, and plurality of memory cells, and the input is coupled to the write row select lines and the write column select lines such that the write row select lines are shared between the first, second, and plurality of memory cells.

31. A method of interconnecting memory cells of a random access memory array, comprising:
   providing a first plurality of transfer gates coupled to a first memory cell and a second plurality of transfer gates coupled to a second memory cell;
   providing a decoder circuit, the decoder circuit comprising a plurality of write port decoders;
   coupling an input of each of the write port decoders to a respective one of a plurality of write row select lines and write column select lines;
   coupling an output of each of the write port decoders to a respective one of the plurality of first and second transfer gates; and
   connecting elements of the first and second transfer gates using only a local interconnect, respectively.

32. The method of claim 31, wherein:
   each of the write port decoders comprises a NAND gate coupled to an inverter; and
   coupling the output of each of the write port decoders further comprises coupling an output of each of the NAND gates and an output of each of the inverters to respective first and second control inputs of each of the respective first and second transfer gates using an interconnect layer disposed above the local interconnect.

33. The method of claim 31, further comprising coupling a scan input/output port to each of the first and second memory cells.

34. The method of claim 31, further comprising coupling at least one read port to each of the first and second memory cells.

35. The method of claim 31, further comprising coupling the first and second memory cells to a shared power bus.

36. The method of claim 31, wherein providing the decoder circuit further comprises providing the decoder circuit substantially between the first and second memory cells.

37. The method of claim 31, wherein the write row select lines are shared between the first and second memory cells.

* * * * *